United States Patent
Ueda

(10) Patent No.: US 7,949,982 B2
(45) Date of Patent: May 24, 2011

(54) SEMICONDUCTOR INTEGRATED CIRCUIT DESIGN SYSTEM, SEMICONDUCTOR INTEGRATED CIRCUIT DESIGN METHOD, AND COMPUTER READABLE MEDIUM

(75) Inventor: Toshiaki Ueda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 310 days.

(21) Appl. No.: 12/331,791

(22) Filed: Dec. 10, 2008

(65) Prior Publication Data

US 2009/0164960 A1    Jun. 25, 2009

(30) Foreign Application Priority Data

Dec. 19, 2007    (JP) ................................ 2007-327437

(51) Int. Cl.
*G06F 9/455*     (2006.01)

(52) U.S. Cl. .......... 716/119; 716/106; 716/111; 716/53; 716/118; 716/126

(58) Field of Classification Search .................. 716/106, 716/111, 119, 100, 53, 118, 126
See application file for complete search history.

(56) References Cited

U.S. PATENT DOCUMENTS

2006/0271907 A1* 11/2006 Izuha et al. ..................... 716/21
2007/0101307 A1* 5/2007 Ueda ............................... 716/10

\* cited by examiner

*Primary Examiner* — Paul Dinh
*Assistant Examiner* — Brian Ngo
(74) *Attorney, Agent, or Firm* — Sprinkle IP Law Group

(57) ABSTRACT

A semiconductor integrated circuit design method has extracting connection-permitted patterns which are permitted to connect to each other in a layout pattern, disconnection-permitted patterns which exercise no effect on a circuit operation even when disconnected in the layout pattern, and a multicut via which suffices when connection is made to at least one via thereof in the layout pattern, by using a net list and a cell library; conducting LRC (Lithography Rule Check) processing on the layout pattern to which a correction pattern resulting from OPC (Optical Proximity Correction) processing is added, and detecting an error part; and judging the error part either as a false error when the error part is included in the connection-permitted patterns, the disconnection-permitted patterns, or the multicut via extracted, or as a true error when the error part is not included in the connection-permitted patterns, the disconnection-permitted patterns, or the multicut via extracted, and making a pattern correction to the error part when the error part is judged as the true error.

11 Claims, 5 Drawing Sheets

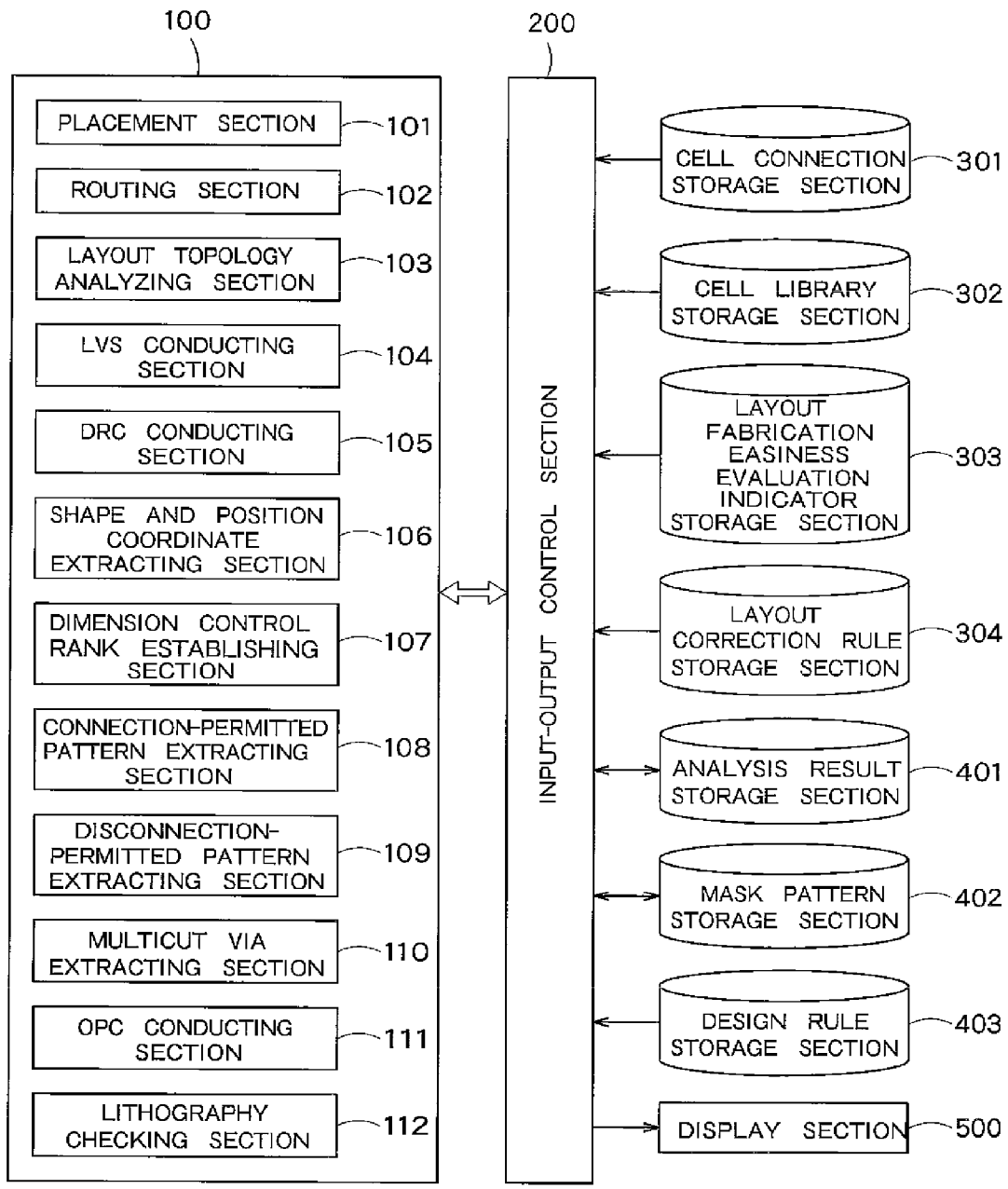
F I G. 1

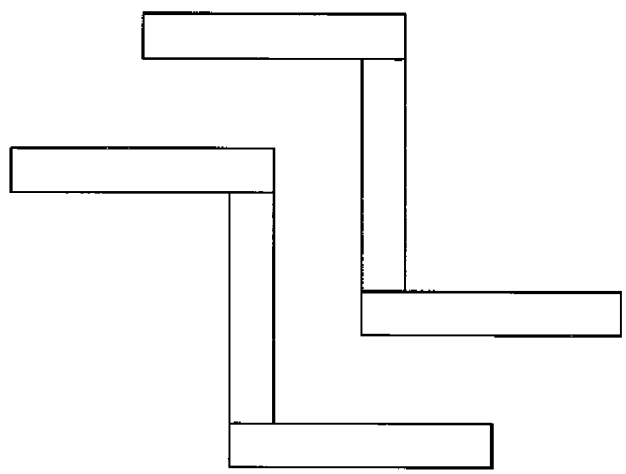
F I G. 2
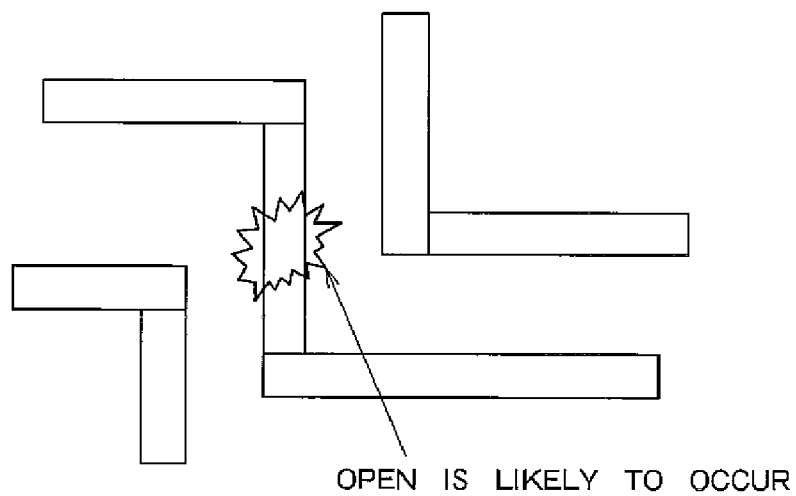
OPEN IS LIKELY TO OCCUR
F I G. 3

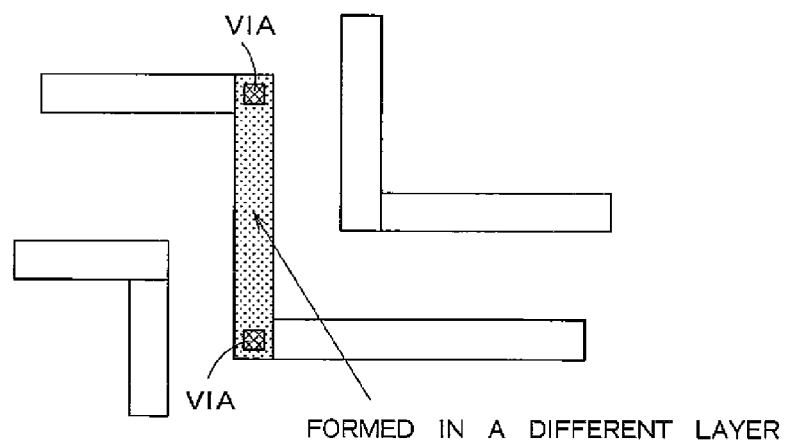
F I G. 5
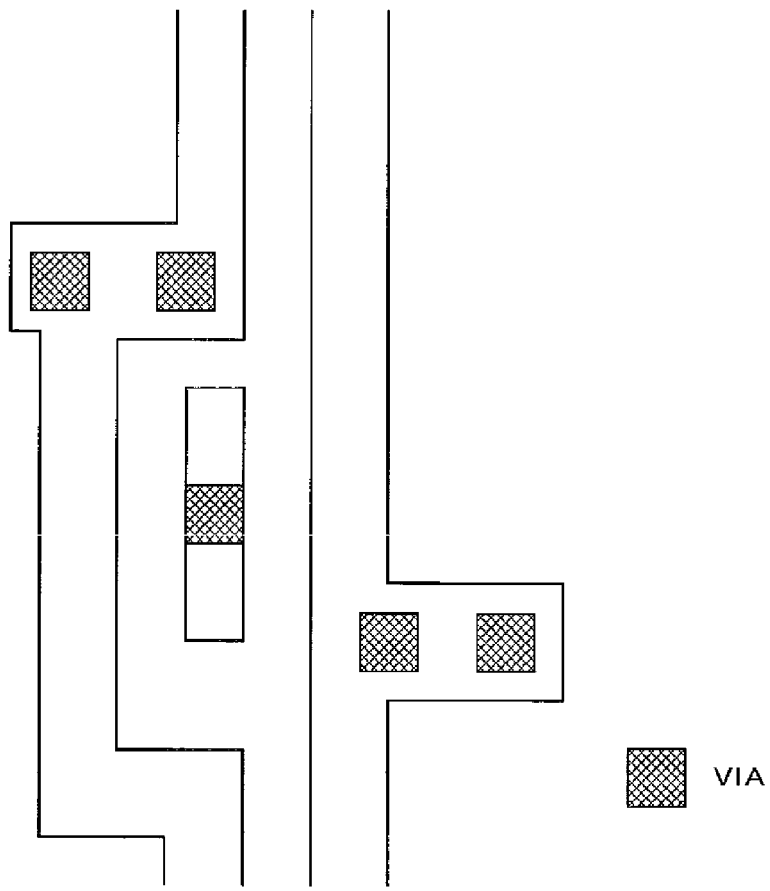
F I G. 6

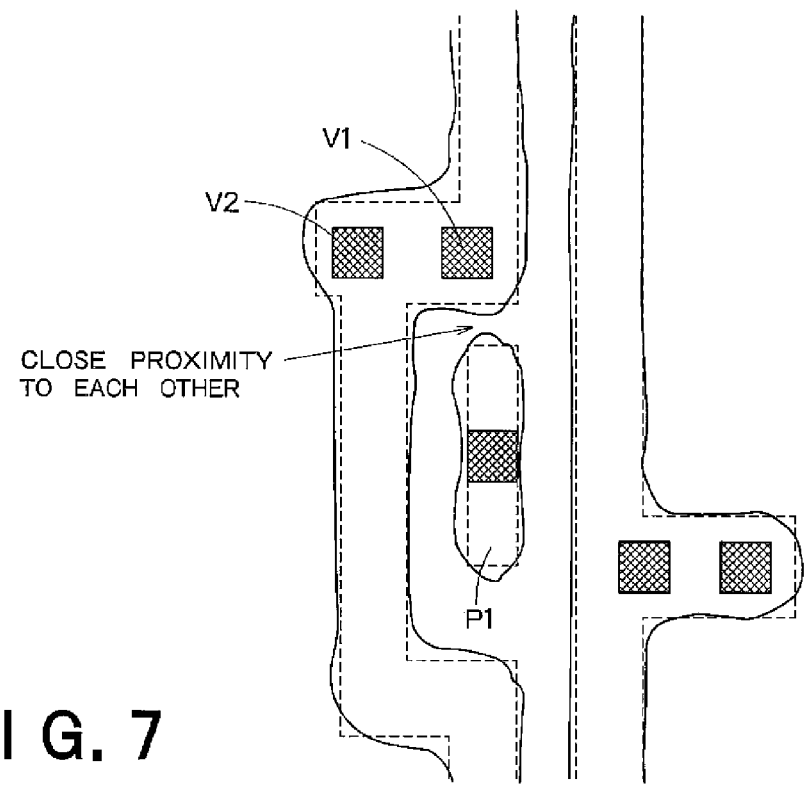
F I G. 7
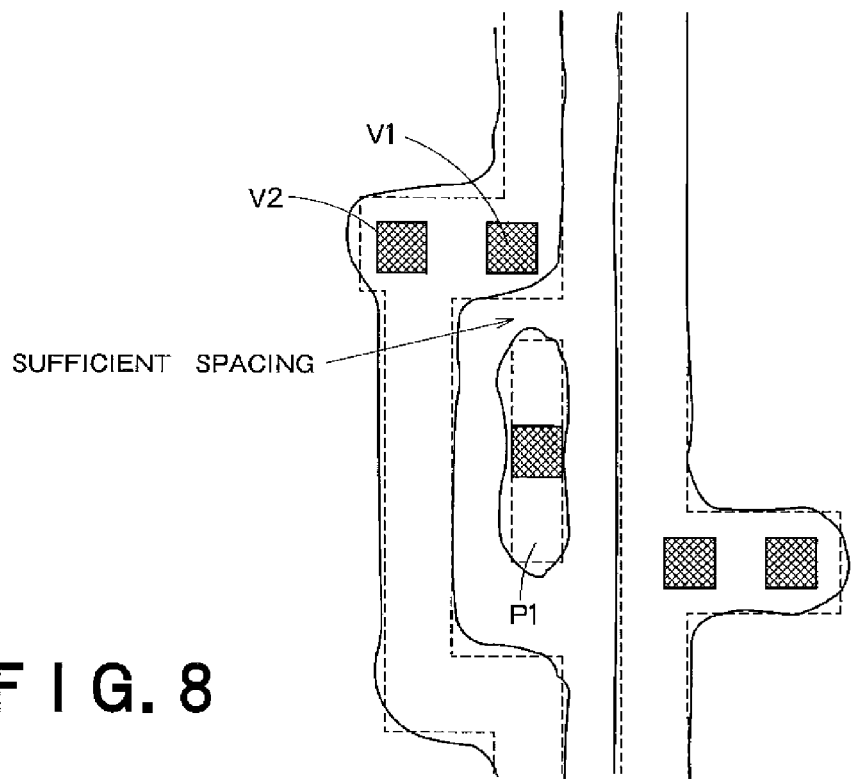
F I G. 8

SEMICONDUCTOR INTEGRATED CIRCUIT DESIGN SYSTEM, SEMICONDUCTOR INTEGRATED CIRCUIT DESIGN METHOD, AND COMPUTER READABLE MEDIUM

CROSS REFERENCE TO RELATED APPLICATIONS

This application is based upon and claims the benefit of priority from the prior Japanese Patent Application No. 2007-327437, filed on Dec. 19, 2007, the entire contents of which are incorporated herein by reference.

BACKGROUND OF THE INVENTION

The present invention relates to a semiconductor integrated circuit design system, a semiconductor integrated circuit design method, and a computer readable medium.

In designing a semiconductor integrated circuit, cells are designed by creating a circuit pattern with use of a minimum possible design rule in a miniaturization technique, and then these cells are placed and routed to make an entire LSI chip design. Subsequently, this layout design pattern is subjected to layout check and correction by LVS (Layout Versus Schematics), DRC (Design Rule Check) and the like. Subsequently, optical correction and pattern adjustment are conducted in processing steps including OPC (Optical Proximity Correction) and MDP (Mask Data Preparation), and the like. Thereafter, the process proceeds to a lithography checking step and then to a wafer fabrication step.

In this way, it has been a conventional practice to make correction and adjustment to imperfections and the like in each process step while fabricating a silicon wafer from a layout pattern of a semiconductor integrated circuit.

However, because a dimension of each transistor or each wire formed on a semiconductor wafer has been reduced to a value substantially equal to a wavelength range of light, it has become difficult to process silicon according to an intended design pattern in the fabrication process. This is because, due to miniaturization and growing integration of mask patterns, neighboring pattern placements have an influence on each other during formation of the pattern by lithography or etching.

In recent years, it has been a common practice to conduct OPC in which a correction pattern is previously added to a design pattern so that desired dimensions are obtained after processing. However, it takes very much processing time for achieving a highly integrated layout pattern with precision. In some cases, proper pattern correction processing cannot be achieved, with the result that the electrical characteristics of a device vary beyond prescribed ranges, thus lowering the chip fabrication yield.

In an attempt to overcome such a problem that a design pattern is generated which cannot be adequately corrected by the OPC processing, a proposal has been made of a method including detecting a pattern that cannot be properly corrected by OPC and correcting a design rule while fabricating a mask pattern.

However, if such a pattern that cannot be properly processed by OPC is merely inhibited, it is still difficult to remove a false error which is not problematic in designing to progress the design. Thus, a problem exists that a great deal of time and labor is required in optimization of the OPC recipe and correction of the design rule for redesign.

A design pattern that is difficult to process by lithography not only exercises a serious effect on fluctuations of electrical characteristics due to a finely processed device structure as well as on the performance and reliability of a semiconductor integrated circuit but also may cause a short circuit or a disconnection in wiring to occur with a certain probability, thus deteriorating the yield. Therefore, when a design pattern that cannot be properly processed by OPC is generated, the process has to be returned from the pattern processing step to the layout design step in order to correct the design pattern itself.

A conventional process from layout design to mask fabrication allows numerous errors to occur at an LRC (Lithography Rule Check) step. Among these errors, a number of false errors are included which are not problematic in designing. The number of true error parts of a layout that necessarily call for pattern corrections is relatively small. However, it takes a great deal of time to judge the numerous errors including such false errors. Thus, the conventional design method involves a problem that a long design period and an increased design cost are required.

SUMMARY OF THE INVENTION

According to one aspect of the present invention, there is provided a semiconductor integrated circuit design system comprising:

a placement section configured to conduct placement of cells based on a net list and a cell library;

a routing section configured to make routing between the cells based on the net list and the cell library;

a layout topology analyzing section configured to evaluate fabrication easiness of a layout pattern, the placement of the cells and the routing between the cells are thus made in the layout pattern, by using a layout fabrication easiness evaluation indicator including a relationship between a predetermined pattern and an effect extent of the predetermined pattern to a yield;

a shape and position coordinate extracting section configured to extract a shape and a position coordinate of the layout pattern and prepare first layout pattern data based on the shape and the position coordinate thus extracted;

a dimension control rank establishing section configured to establish a dimension control rank to be given to the layout pattern which is indicative of a level of detail of dimension control, by using the net list and the cell library;

a connection-permitted pattern extracting section configured to detect circuit information to have equal potential and extract connection-permitted patterns which are permitted to connect to each other in the layout pattern, by using the net list and the cell library;

a disconnection-permitted pattern extracting section configured to extract disconnection-permitted patterns which exercise no effect on a circuit operation even when disconnected in the layout pattern, by using the net list and the cell library;

a multicut via extracting section configured to extract a multicut via which suffices when connection is made to at least one via thereof in the layout pattern, by using the net list and the cell library;

an OPC conducting section configured to conduct OPC (Optical Proximity Correction) processing on the first layout pattern data with a precision according to the dimension control rank, add a correction pattern to the layout pattern, and prepare second layout pattern data based on the layout pattern which the correction pattern is thus added to; and a lithography checking section configured to conduct LRC (Lithography Rule Check) processing on the second layout pattern data with a precision according to the dimension control rank, judge a detected error part either as a false error when the detected error part is included in the connection-permitted patterns, the disconnection-permitted patterns, or the multicut via extracted, or as a true error when the detected error part is not included in the connection-permitted patterns, the disconnection-permitted patterns, or the multicut via extracted, and issues a pattern correction instruction to correct the error part when the error part is judged as the true error.

According to one aspect of the present invention, there is provided a semiconductor integrated circuit design method comprising:

conducting placement of cells and making routing between the cells based on a net list and a cell library to prepare a layout pattern;

evaluating fabrication easiness of the layout pattern by using a layout fabrication easiness evaluation indicator including a relationship between a predetermined pattern and an effect extent of the predetermined pattern to a yield;

extracting a shape and a position coordinate of the layout pattern after the layout pattern has been evaluated as being easy to fabricate and preparing first layout pattern data based on the shape and the position coordinate thus extracted;

establishing a dimension control rank to be given to the layout pattern which is indicative of a level of detail of dimension control, by using the net list and the cell library;

detecting circuit information to have equal potential and extracting connection-permitted patterns which are permitted to connect to each other in the layout pattern, by using the net list and the cell library;

extracting disconnection-permitted patterns which exercise no effect on a circuit operation even when disconnected in the layout pattern, by using the net list and the cell library;

extracting a multicut via which suffices when connection is made to at least one via thereof in the layout pattern, by using the net list and the cell library;

conducting OPC (Optical Proximity Correction) processing on the first layout pattern data with a precision according to the dimension control rank, adding a correction pattern to the layout pattern, and preparing second layout pattern data based on the layout pattern which the correction pattern is thus added to;

conducting LRC (Lithography Rule Check) processing on the second layout pattern data with a precision according to the dimension control rank and detecting an error part; and judging the error part either as a false error when the error part is included in the connection-permitted patterns, the disconnection-permitted patterns, or the multicut via extracted, or as a true error when the error part is not included in the connection-permitted patterns, the disconnection-permitted patterns, or the multicut via extracted, and making a pattern correction to the error part when the error part is judged as the true error.

According to one aspect of the present invention, there is provided a computer readable medium storing a semiconductor integrated circuit design program, the semiconductor integrated circuit design program causes a computer to execute the steps of:

conducting placement of cells and making routing between the cells based on a net list and a cell library to prepare a layout pattern;

evaluating fabrication easiness of the layout pattern by using a layout fabrication easiness evaluation indicator including a relationship between a predetermined pattern and an effect extent of the predetermined pattern to a yield;

extracting a shape and a position coordinate of the layout pattern after the layout pattern has been evaluated as being easy to fabricate and preparing first layout pattern data based on the shape and the position coordinate thus extracted;

establishing a dimension control rank to be given to the layout pattern which is indicative of a level of detail of dimension control, by using the net list and the cell library;

detecting circuit information to have equal potential and extracting connection-permitted patterns which are permitted to connect to each other in the layout pattern, by using the net list and the cell library;

extracting disconnection-permitted patterns which exercise no effect on a circuit operation even when disconnected in the layout pattern, by using the net list and the cell library;

extracting a multicut via which suffices when connection is made to at least one via thereof in the layout pattern, by using the net list and the cell library;

conducting OPC (Optical Proximity Correction) processing on the first layout pattern data with a precision according to the dimension control rank, adding a correction pattern to the layout pattern, and preparing second layout pattern data based on the layout pattern which the correction pattern is thus added to;

conducting LRC (Lithography Rule Check) processing on the second layout pattern data with a precision according to the dimension control rank and detecting an error part; and judging the error part either as a false error when the error part is included in the connection-permitted patterns, the disconnection-permitted patterns, or the multicut via extracted, or as a true error when the error part is not included in the connection-permitted patterns, the disconnection-permitted patterns, or the multicut via extracted, and making a pattern correction to the error part when the error part is judged as the true error.

BRIEF DESCRIPTION OF THE DRAWINGS

FIG. 1 is a schematic block diagram showing a configuration of a semiconductor integrated circuit design system according to an embodiment of the present invention;

FIG. 2 is a view showing one exemplary pattern that becomes as a yield lowering factor;

FIG. 3 is a view showing one exemplary pattern which is likely to allow an open to occur;

FIG. 5 is a view showing one exemplary layout pattern modification;

FIG. 6 is a view showing one exemplary routing pattern;

FIG. 7 is a view showing one exemplary routing pattern obtained after OPC processing; and FIG. 8 is a view showing one exemplary routing pattern obtained after OPC processing based on multicut via information.

DESCRIPTION OF THE INVENTION EMBODIMENTS

Figure 4:
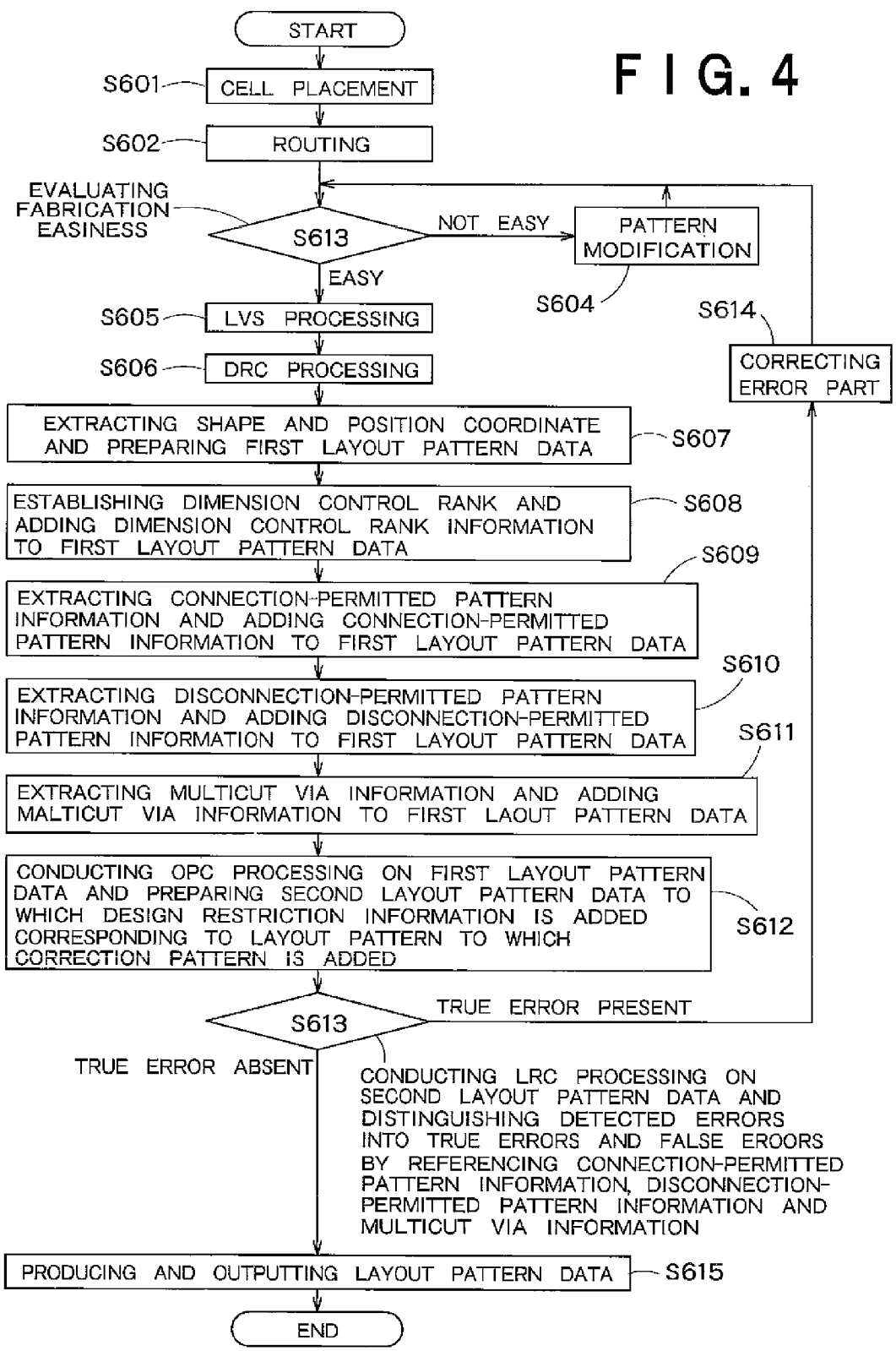
FIG. 4 is a flowchart illustrating a semiconductor integrated circuit design method according to the same embodiment.

Hereinafter, embodiments of the present invention will be described with reference to the drawings.

FIG. 1 schematically shows a configuration of a semiconductor integrated circuit design system according to an embodiment of the present invention. The design system 100 includes a placement section 101, a routing section 102, a layout topology analyzing section 103, an LVS conducting section 104, a DRC conducting section 105, a shape and position coordinate extracting section 106, a dimension control rank establishing section 107, a connection-permitted pattern extracting section 108, a disconnection-permitted pattern extracting section 109, a multicut via extracting section 110, an OPC conducting section 111, and a lithography checking section 112.

The design system 100 is connected, via an input-output control section 200, to each of a cell connection storage section 301, a cell library storage section 302, a layout fabrication easiness evaluation indicator storage section 303, a layout correction rule storage section 304, an analysis result storage section 401, a mask pattern storage section 402, a design rule storage section 403, and a display section 500.

The cell connection storage section 301 stores therein design information (net list) on connections associated with cells and routing. The cell library storage section 302 stores therein a cell library which is design information on the cells (logic information).

The layout fabrication easiness evaluation indicator storage section 303 stores therein information on a relationship between a predetermined pattern shape and an extent to which the presence of the pattern shape exercises an effect on the chip fabrication yield. The information stored in the section 303 includes information on a degree of a decrease in yield that occurs when, for example, key-shaped patterns as shown in FIG. 2 are formed as located adjacent to each other.

The layout correction rule storage section 304 stores therein a layout correction rule which improves the chip fabrication yield. For example, the layout correction rule prescribes that when, for example, patterns as shown in FIG. 2 are present, the spacing between the patterns should be increased by one grid. The layout correction rule also prescribes a rule to change a single via to a double via, and other rules.

The design rule storage section 403 stores therein a design rule to be used in DRC (Design Rule Check) processing. The design rule prescribes information on a spacing required between adjacent wires, wire widths, and the like.

The placement section 101 conduct placement of cells and routing section 102 of the design system 100 make routing between the cells, by referencing the net list stored in the cell connection storage section 301 and the cell library stored in the cell library storage section 302.

The layout topology analyzing section 103 detects the proportion of patterns each causing the yield to lower in the whole chip by using a layout fabrication easiness evaluation indicator stored in the layout fabrication easiness evaluation indicator storage section 303, and analyzes the yield of a layout pattern to evaluate the fabrication easiness of the layout pattern. The result of the analysis is stored into the analysis result storage section 401.

If the layout pattern is evaluated as being not easy to fabricate, the placement section 101 and routing section 102 make a reference to the layout correction rule stored in the layout correction rule storage section 304 to correct the placement and make routing of the cells.

The LVS conducting section 104 conducts LVS (Layout Versus Schematics) processing, extracts a circuit diagram expressed by the layout pattern in which the placement and routing of the cells are made, and checks whether or not cells and interconnections between the cells which have been designed in a logic and circuit design stage are correctly expressed.

The DRC conducting section 105 conducts DRC (Design Rule Check) to check whether or not the layout pattern meets a predetermined design rule by referencing the design rule stored in the design rule storage section 403.

The shape and position coordinate extracting section 106 extracts the shape and position coordinate of the layout pattern, prepares GDS data (first layout pattern data) based on the shape and position coordinate thus extracted, and stores the GDS data into the mask pattern storage section 402.

The dimension control rank establishing section 107 establishes ranks indicative of levels of detail at which dimension control is to be performed on respective layout patterns, by using the net list stored in the cell connection storage section 301 and the cell library stored in the cell library storage section 302.

For example, three ranks "A", "B" and "C" indicative of respective levels of detail of dimension control are established (in the descending order of level of detail). Subsequently, critical paths and dummy patterns having no relation to the circuit configuration are detected. Layout patterns on the critical paths are ranked "A", while the dummy patterns are ranked "C". Other patterns are ranked "B".

For example, a layout pattern as shown in FIG. 3 is likely to allow an open to occur in a routing pattern of a central routing segment. For this reason, a higher level of detail of dimension control is given to such a part (unless the routing pattern is a dummy pattern).

The dimension control rank establishing section 107 adds information on the dimension control ranks thus established to the GDS data and stores the information into the mask pattern storage section 402.

The connection-permitted pattern extracting section 108 detects circuit information to have equal potential and extracts patterns that are permitted to connect to (contact) each other, by using the net list stored in the cell connection storage section 301 and the cell library stored in the cell library storage section 302. The connection-permitted pattern extracting section 108 adds connection-permitted pattern information thus extracted to the GDS data and stores the information into the mask pattern storage section 402.

The disconnection-permitted pattern extracting section 109 detects redundant patterns and dummy patterns and extracts patterns that may be disconnected (that exercise no effect on the circuit operation), by using the net list stored in the cell connection storage section 301 and the cell library stored in the cell library storage section 302. The disconnection-permitted pattern extracting section 109 adds disconnection-permitted pattern information thus extracted to the GDS data and stores the information into the mask pattern storage section 402.

The multicut via extracting section 110 extracts from multicut vias included in a layout pattern a multicut via that suffices when connection is made to at least one via thereof. For example, when the two vias of a double-cut via are connected to the same destination, the two vias are linked to each other. By so doing, even when one of the two vias is disconnected, the circuit can operate without any trouble as long as the other via is connected to the destination. The multicut via extracting section 110 adds multicut via information thus extracted to the GDS data and stores the information into the mask pattern storage section 402.

By newly using a layer of purpose or property for example, the dimension control rank information, connection-permitted pattern information, disconnection-permitted pattern information and multicut via information can be added thereto.

The OPC conducting section 111 takes out the GDS data (first layout pattern data) from the mask pattern storage section 402, conducts OPC (Optical Proximity Correction) processing, and adds a correction pattern to the layout pattern. At that time, the OPC processing is conducted by referencing the dimension control rank information added to the GDS data.

For example, a part at a higher level of detail of dimension control is subjected to higher definition OPC processing (i.e., with a larger number of sampling points). By so doing, the processing load can be reduced as compared with a case where all the layout patterns are subjected to precise OPC processing.

In cases where a clock signal line on a chip is regarded as a critical path set at a higher level of detail of dimension control and is subjected to higher definition OPC processing, it is possible to suppress delay variations of the clock signal line. By so doing, the skew adjustment of the line up to each flip-flop can be made more correctly, so that the timing design margin of the chip can be reduced. Further, delay fluctuations caused by variations in capacitance and resistance due to dimensional errors can be made smaller.

The OPC conducting section 111 stores GDS data (second layout pattern data) to which the correction pattern resulting from the OPC processing is added into the mask pattern storage section 402.

The lithography checking section 112 takes out the GDS data (second layout pattern data) resulting from the OPC processing from the mask pattern storage section 402 and conducts so-called "LRC (Lithography Rule Check)" processing by which a layout and a pattern image on the wafer are compared with each other and the difference therebetween is checked according to lithography fabrication rules. The LRC processing is conducted by referencing the dimension control rank information added to the GDS data.

In error judgment by the LRC processing, the lithography checking section 112 distinguishes between false errors and true errors by using the connection-permitted pattern information, disconnection-permitted pattern information and multicut via information added to the GDS data.

For example, when detection is made of adjacent patterns contacting each other in the LRC processing, the patterns contacting each other are regarded as a false error if these patterns are included in the connection-permitted pattern information, and no correction is made to the layout. This is because these patterns arise no problem even when the patterns are brought into contact with each other by actual lithography processing. If the patterns of question are not included in the connection-permitted pattern information, the patterns are judged as a true error.

Similarly, when detection is made of patterns disconnected in the LRC processing, the patterns of question are regarded as a false error if these patterns are included in the disconnection-permitted pattern information. If the patterns of question are not included in the disconnection-permitted pattern information, the patterns are judged as a true error.

When detection is made of a multicut via having holes any one of which cannot have sufficient coverage in the LRC processing, the multicut via is regarded as a false error if the multicut via is included in the muticut via information. If the multicut via of question is not included in the muticut via information, the multicut via is judged as a true error.

The lithography checking section 112 issues an instruction to make a pattern correction to a part judged as a true error in the LRC processing. According to the pattern correction instruction, the placement section 101 and routing section 102 correct the layout pattern. After the pattern correction, only the corrected part is subjected to the layout topology analysis, LVS processing, DRC processing, OPC processing and LRC processing.

Layout pattern data in which any true error has not been detected in the LRC processing by the lithography checking section 112 is stored into the mask pattern storage section 402. A photomask is fabricated based on the pattern data thus stored.

The display section 500 is capable of displaying the layout pattern data.

With reference to the flowchart shown in FIG. 4, description will be made of the flow of processing from the laying out of a semiconductor integrated circuit to the lithography checking with use of the above-described semiconductor integrated circuit design system.

(STEP S601) The placement section 101 conducts the placement of cells.

(STEP S602) The routing section 102 makes routing between the cells.

(STEP S603) The layout topology analyzing section 103 evaluates the fabrication easiness of a layout pattern based on the fabrication easiness evaluation indicator. If the layout pattern is evaluated as being easy to fabricate, the process proceeds to STEP S605. If the layout pattern is evaluated as being not easy to fabricate, the process proceeds to STEP S604.

(STEP S604) The layout pattern is modified by the placement section 101 and routing section 102 based on the layout correction rule.

(STEP S605) The LVS conducting section 104 conducts the LVS processing.

(STEP S606) The DRC conducting section 105 conducts the DRC processing.

(STEP S607) The shape and position coordinate extracting section 106 extracts shape and position coordinate information on the layout pattern and outputs GDS data (first layout pattern data).

(STEP S608) The dimension control rank establishing section 107 establishes dimension control ranks indicative of levels of detail at which the dimension control is to be performed on respective layout patterns, by using the net list information stored in the cell connection storage section 301 and the cell library information stored in the cell library storage section 302. The dimension control rank establishing section 107 adds dimension control rank information thus established to the GDS data (first layout pattern data). For example, the dimension control rank establishing section 107 newly uses a layer of purpose or property of the GDS data for the dimension control rank information to be added thereto.

(STEP S609) The connection-permitted pattern extracting section 108 extracts the connection-permitted pattern information. The connection-permitted pattern extracting section 108 adds the connection-permitted pattern information thus extracted to the GDS data (first layout pattern data). For example, the connection-permitted pattern extracting section 108 newly uses the layer of purpose or property of the GDS data for the connection-permitted pattern information to be added thereto.

(STEP S610) The disconnection-permitted pattern extracting section 109 extracts the disconnection-permitted pattern information. The disconnection-permitted pattern extracting section 109 adds the disconnection-permitted pattern information thus extracted to the GDS data (first layout pattern data). For example, the disconnection-permitted pattern extracting section 109 newly uses the layer of purpose or property of the GDS data for the disconnection-permitted pattern information to be added thereto.

(STEP S611) The multicut via extracting section 110 extracts the multicut via information. The multicut via extracting section 110 adds the multicut via information thus extracted to the GDS data (first layout pattern data). For example, the multicut via extracting section 110 newly uses the layer of purpose or property of the GDS data for the multicut via information to be added thereto.

(STEP S612) The OPC conducting section 111 conducts the OPC processing on the GDS data (first layout pattern data) to which design restriction information (including the dimension control rank information, connection-permitted pattern information, disconnection-permitted pattern information and multicut via information) has been added in STEPs S608 to S611, based on the dimension control rank information. GDS data (second layout pattern data) is prepared based on the layout pattern to which a correction pattern resulting from the OPC processing is added.

Like the first layout pattern data, the second layout pattern data has similar design restriction information added thereto.

(STEP S613) The lithography checking section 112 conducts the LRC processing on the GDS data (second layout pattern data) by utilizing the design restriction information added thereto, such as the dimension control rank information.

The lithography checking section 112 distinguishes errors detected by the LRC processing into false errors and true errors by referencing the connection-permitted pattern information, disconnection-permitted pattern information, and multicut via information. If there is any true error, the process proceeds to STEP S614. If there is no true error, the process proceeds to STEP S615.

(STEP S614) The placement section 101 and routing section 102 make a layout pattern correction to the true error part.

(STEP S615) Layout pattern data to be used in the photomask fabrication is produced and outputted.

When, for example, a pattern as shown in FIG. 3 is detected by the fabrication easiness evaluation processing (layout topology analysis) in STEP S603, the routing pattern of the central routing segment is formed in a different layer (upper or lower layer) by way of vias as shown in FIG. 5 by the pattern modification in STEP S604. By so forming this routing pattern in the different layer, the level of detail of dimension control to be established for the pattern of concern in STEP S608 can be lowered.

If the pattern of concern is a critical path (e.g., clock signal line), attention has to be paid to whether or not delay time fluctuations can be made to fall within a predetermined range by forming the pattern in the different layer. If delay time fluctuations can fall within the predetermined range, the routing pattern is formed in the different layer. If delay time fluctuations cannot fall within the predetermined range, the level of detail of dimension control is set higher in STEP S608 without a layer change. By so doing, the OPC processing on the routing pattern of the central routing segment in STEP S612 is conducted with a higher definition and, hence, the pattern can be formed more precisely.

Assume that: a pattern as shown in FIG. 7, wherein a peripheral portion of a via V1 and a routing pattern P1 are located in close proximity to each other, is obtained as a result of addition of a correction pattern by the OPC processing in STEP S612 with a view to forming a pattern as shown in FIG. 6 for example; and the portions located in close proximity to each other are detected as an error by the LRC processing in STEP S613. In FIG. 7, the pattern resulting from the addition of the correction pattern is depicted by solid line and a design pattern is depicted by dotted line.

In this case, the lithography checking section 112 first checks whether or not the routing pattern including the via V1 and the routing pattern P1 are included in the connection-permitted pattern information. If these patterns are included in the connection-permitted pattern information, the lithography checking section 112 regards the error detected as a false error and fails to issue a correction instruction. If the patterns of question are not included in the connection-permitted pattern information, the lithography checking section 112 references the multicut via information to check whether or not the multicut via information includes vias V1 and V2, that is, whether or not the vias V1 and V2 are linked to each other.

If the vias V1 and V2 are included in the multicut via information (i.e., if the vias V1 and V2 are linked to each other), these vias can be judged as will suffice if only the via V2 is covered. Therefore, the lithography checking section 112 issues an instruction not to cover the via V1 in the OPC processing.

A pattern as shown in FIG. 8 is obtained by the OPC processing according to this instruction. Thus, it is possible to provide a sufficient spacing between the peripheral portion of the via V1 and the routing pattern P1 and hence cancel the error. Though it is possible that the via V1 is not formed as designed (because of defective coverage), there arises no problem associated with the circuit operation because the routing pattern can be connected to a different layer by way of the via V2. Also, there is no need to correct the layout pattern and, hence, the design period can be shortened. If the vias V1 and V2 are not included in the multicut via information (i.e., if the vias V1 and V2 are not linked to each other), these vias are judged as a true error. Therefore, the lithography checking section 112 issues an instruction to correct the layout pattern.

As described above, the laying out step and the lithography checking step coordinate with each other, so that a true error calling for a pattern correction and a false error not calling for any pattern correction can be distinguished from each other by referencing the connection-permitted pattern information, disconnection-permitted pattern information and multicut via information added to the GDS data. Thus, it is possible to reduce the number of pattern corrections, shorten the fabrication period from the layout design to the mask fabrication, and reduce the design cost.

Among true errors detected by the LRC processing, those errors which cannot be resolved by fabrication control measures or which call for costly means for their resolutions (high-performance lithographic apparatus for example) are handled on the cell/chip design side. By so doing, it is possible to suppress occurrences of error patterns which allow an open or a short circuit to occur, reduce the load of lithography checking, and shorten the checking period.

Since the layout pattern is formed using the layout fabrication easiness evaluation indicator so as to enhance the yield, a high fabrication yield can be realized.

When an error occurs in the LVS processing (S605) or DRC processing (S606) after the layout topology analysis (S604), the layout correction rule is corrected because the layout correction rule is considered to have an error.

A program for realizing the semiconductor integrated circuit design method according to the embodiment described above can be stored in a recording medium. When the program stored in the recording medium is loaded into a computer system, the program can be executed to realize the above-described semiconductor integrated circuit design and fabrication by controlling the computer. The "recording medium" as mentioned herein, is meant to include any device which is capable of recording a program, such as a memory device, a magnetic disk device, and an optical disk device.

What is claimed is:

1. A semiconductor integrated circuit design system comprising:
- a placement section configured to conduct placement of cells based on a net list and a cell library;
- a routing section configured to make routing between the cells based on the net list and the cell library;
- a layout topology analyzing section configured to evaluate fabrication easiness of a layout pattern, the placement of the cells and the routing between the cells are thus made in the layout pattern, by using a layout fabrication easiness evaluation indicator including a relationship between a predetermined pattern and an effect extent of the predetermined pattern to a yield;
- a shape and position coordinate extracting section configured to extract a shape and a position coordinate of the layout pattern and prepare first layout pattern data based on the shape and the position coordinate thus extracted;
- a dimension control rank establishing section configured to establish a dimension control rank to be given to the layout pattern which is indicative of a level of detail of dimension control, by using the net list and the cell library;
- a connection-permitted pattern extracting section configured to detect circuit information to have equal potential and extract connection-permitted patterns which are permitted to connect to each other in the layout pattern, by using the net list and the cell library;
- a disconnection-permitted pattern extracting section configured to extract disconnection-permitted patterns which exercise no effect on a circuit operation even when disconnected in the layout pattern, by using the net list and the cell library;
- a multicut via extracting section configured to extract a multicut via which suffices when connection is made to at least one via thereof in the layout pattern, by using the net list and the cell library;
- an OPC conducting section configured to conduct OPC (Optical Proximity Correction) processing on the first layout pattern data with a precision according to the dimension control rank, add a correction pattern to the layout pattern, and prepare second layout pattern data based on the layout pattern which the correction pattern is thus added to; and
- a lithography checking section configured to conduct LRC (Lithography Rule Check) processing on the second layout pattern data with a precision according to the dimension control rank, judge a detected error part either as a false error when the detected error part is included in the connection-permitted patterns, the disconnection-permitted patterns, or the multicut via extracted, or as a true error when the detected error part is not included in the connection-permitted patterns, the disconnection-permitted patterns, or the multicut via extracted, and issues a pattern correction instruction to correct the error part when the error part is judged as the true error.

2. The semiconductor integrated circuit design system according to claim 1, wherein the dimension control rank establishing section detects a pattern corresponding to a critical path and a dummy pattern in the layout pattern and establishes different dimension control ranks to be given to respective of the pattern corresponding to the critical path, the dummy pattern, and a pattern neither corresponding to the critical path nor included in the dummy pattern, by using the net list and the cell library.

3. The semiconductor integrated circuit design system according to claim 2, wherein with a clock signal line regarded as the critical path, the dimension control rank establishing section establishes a dimension control rank to be given to the pattern corresponding to the critical path which is indicative of a higher level of detail than the dimension control ranks to be given to the dummy pattern and the pattern neither corresponding to the critical path nor included in the dummy pattern.

4. The semiconductor integrated circuit design system according to claim 1, wherein the placement section and the routing section make a layout pattern correction to the error part according to the pattern correction instruction.

5. A semiconductor integrated circuit design method comprising:
using a computer to perform the steps of:
- conducting placement of cells and making routing between the cells based on a net list and a cell library to prepare a layout pattern;
- evaluating fabrication easiness of the layout pattern by using a layout fabrication easiness evaluation indicator including a relationship between a predetermined pattern and an effect extent of the predetermined pattern to a yield;
- extracting a shape and a position coordinate of the layout pattern after the layout pattern has been evaluated as being easy to fabricate and preparing first layout pattern data based on the shape and the position coordinate thus extracted;
- establishing a dimension control rank to be given to the layout pattern which is indicative of a level of detail of dimension control, by using the net list and the cell library;
- detecting circuit information to have equal potential and extracting connection-permitted patterns which are permitted to connect to each other in the layout pattern, by using the net list and the cell library;
- extracting disconnection-permitted patterns which exercise no effect on a circuit operation even when disconnected in the layout pattern, by using the net list and the cell library;
- extracting a multicut via which suffices when connection is made to at least one via thereof in the layout pattern, by using the net list and the cell library;
- conducting OPC (Optical Proximity Correction) processing on the first layout pattern data with a precision according to the dimension control rank, adding a correction pattern to the layout pattern, and preparing second layout pattern data based on the layout pattern which the correction pattern is thus added to;
- conducting LRC (Lithography Rule Check) processing on the second layout pattern data with a precision according to the dimension control rank and detecting an error part; and
- judging the error part either as a false error when the error part is included in the connection-permitted patterns, the disconnection-permitted patterns, or the multicut via extracted, or as a true error when the error part is not included in the connection-permitted patterns, the disconnection-permitted patterns, or the multicut via extracted, and making a pattern correction to the error part when the error part is judged as the true error.

6. The semiconductor integrated circuit design method according to claim 5, wherein when the layout pattern is evaluated as being not easy to fabricate, the layout pattern is corrected according to a predetermined layout correction rule.

7. The semiconductor integrated circuit design method according to claim 5, wherein in establishing the dimension control rank, a pattern corresponding to a critical path and a dummy pattern are detected in the layout pattern and then different dimension control ranks to be given to respective of the pattern corresponding to the critical path, the dummy pattern and a pattern neither corresponding to the critical path nor included in the dummy pattern are established, by using the net list and the cell library.

8. The semiconductor integrated circuit design method according to claim 7, wherein with a clock signal line regarded as the critical path, a dimension control rank to be given to the pattern corresponding to the critical path is established which is indicative of a higher level of detail than the dimension control ranks to be given to the dummy pattern and the pattern neither corresponding to the critical path nor included in the dummy pattern.

9. A non-transitory computer readable medium storing a semiconductor integrated circuit design program, wherein the semiconductor integrated circuit design program causes a computer to execute the steps of:

conducting placement of cells and making routing between the cells based on a net list and a cell library to prepare a layout pattern;

evaluating fabrication easiness of the layout pattern by using a layout fabrication easiness evaluation indicator including a relationship between a predetermined pattern and an effect extent of the predetermined pattern to a yield;

extracting a shape and a position coordinate of the layout pattern after the layout pattern has been evaluated as being easy to fabricate and preparing first layout pattern data based on the shape and the position coordinate thus extracted;

establishing a dimension control rank to be given to the layout pattern which is indicative of a level of detail of dimension control, by using the net list and the cell library;

detecting circuit information to have equal potential and extracting connection-permitted patterns which are permitted to connect to each other in the layout pattern, by using the net list and the cell library;

extracting disconnection-permitted patterns which exercise no effect on a circuit operation even when disconnected in the layout pattern, by using the net list and the cell library;

extracting a multicut via which suffices when connection is made to at least one via thereof in the layout pattern, by using the net list and the cell library;

conducting OPC (Optical Proximity Correction) processing on the first layout pattern data with a precision according to the dimension control rank, adding a correction pattern to the layout pattern, and preparing second layout pattern data based on the layout pattern which the correction pattern is thus added to;

conducting LRC (Lithography Rule Check) processing on the second layout pattern data with a precision according to the dimension control rank and detecting an error part; and judging the error part either as a false error when the error part is included in the connection-permitted patterns, the disconnection-permitted patterns, or the multicut via extracted, or as a true error when the error part is not included in the connection-permitted patterns, the disconnection-permitted patterns, or the multicut via extracted, and making a pattern correction to the error part when the error part is judged as the true error.

10. The non-transitory computer readable medium according to claim 9, wherein the semiconductor integrated circuit design program causes a computer to execute the step of correcting the layout pattern according to a predetermined layout correction rule when the layout pattern is evaluated as being not easy to fabricate.

11. The non-transitory computer readable medium according to claim 9, wherein the semiconductor integrated circuit design program causes a computer to execute the steps of:

detecting a pattern corresponding to a critical path and a dummy pattern in the layout pattern by using the net list and the cell library; and establishing different dimension control ranks to be given to respective of the pattern corresponding to the critical path, the dummy pattern, and a pattern neither corresponding to the critical path nor included in the dummy pattern, in the step of establishing the dimension control rank.

* * * * *